(12) United States Patent
Ohnishi et al.

(10) Patent No.: US 9,240,544 B2
(45) Date of Patent: Jan. 19, 2016

(54) METHOD OF MANUFACTURING PIEZOELECTRIC ELEMENT

(75) Inventors: Takao Ohnishi, Aichi-prefecture (JP); Hideki Shimizu, Obu (JP); Takashi Ebigase, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 1036 days.

(21) Appl. No.: 13/115,442

(22) Filed: May 25, 2011

(65) Prior Publication Data

US 2011/0289744 A1 Dec. 1, 2011

(30) Foreign Application Priority Data

May 26, 2010 (JP) ................................. 2010-120698

(51) Int. Cl.
*H04R 17/00* (2006.01)
*H01L 41/33* (2013.01)
(Continued)

(52) U.S. Cl.
CPC .............. *H01L 41/33* (2013.01); *C04B 35/493* (2013.01); *H01L 41/29* (2013.01); *H01L 41/43* (2013.01); *C04B 2235/3206* (2013.01); *C04B 2235/3255* (2013.01); *C04B 2235/3279* (2013.01); *C04B 2235/6025* (2013.01); *C04B 2235/768* (2013.01); *Y10T 29/42* (2015.01)

(58) Field of Classification Search
CPC ......... H01L 41/09; H01L 41/18; H01L 41/22; H01L 41/25; H01L 41/27; H01L 41/29; H01L 41/35; B41J 2/045; B41J 2/55; B41J 2/1621; B41J 2/1623; B41J 2/1628; B41J 2/1629; B41J 2/1635; B41J 2/1643; B41J 2/1646; B41J 2/1607; B41J 2/1612; B41J 2/162; B41J 2/14277

USPC .................. 29/25.35, 592.1, 594, 602.1, 609, 29/609.1; 216/62, 65, 66; 310/324, 328, 310/330, 331, 335, 348; 347/68, 70, 71

See application file for complete search history.

(56) References Cited

U.S. PATENT DOCUMENTS 4,946,665 A * 8/1990 Recasens et al. ............. 423/608
5,831,651 A 11/1998 Usui et al.
(Continued)

FOREIGN PATENT DOCUMENTS

JP 2001-068751 A1 3/2001
JP 2001-320101 11/2001
(Continued)

OTHER PUBLICATIONS

Chinese Office Action (Application No. 201180024975.2) dated Apr. 28, 2014.
(Continued)

*Primary Examiner* — Paul D Kim
(74) *Attorney, Agent, or Firm* — Burr & Brown, PLLC

(57) ABSTRACT

A method of manufacturing a piezoelectric element including a step of preparing a green sheet A including a portion which becomes a fired piezoelectric body later, by use of a piezoelectric material; a step of joining, to at least one surface of the green sheet A, a green sheet B having an opening in a portion facing the portion which becomes the fired piezoelectric body later, followed by firing to obtain the fired piezoelectric body provided with a reinforcing plate to which the reinforcing plate formed owing to the firing of the green sheet B is attached; and a step of forming a film-like electrode in a portion obtained by the firing of the green sheet A in the fired piezoelectric body provided with the reinforcing plate.

41 Claims, 9 Drawing Sheets

(51) Int. Cl.
*C04B 35/493* (2006.01)
*H01L 41/29* (2013.01)
*H01L 41/43* (2013.01)

(56) References Cited

U.S. PATENT DOCUMENTS

| | | | |
|---|---|---|---|
| 6,256,849 B1 * | 7/2001 | Kim | 29/25.35 |
| 8,262,203 B2 * | 9/2012 | Hirai et al. | 347/71 |
| 8,360,558 B2 * | 1/2013 | Hirai et al. | 347/70 |
| 8,416,484 B2 * | 4/2013 | Kanno et al. | 359/224.1 |
| 8,459,783 B2 * | 6/2013 | Hirai et al. | 347/71 |
| 8,482,832 B2 * | 7/2013 | Kotera et al. | 359/224.1 |
| 8,506,057 B2 * | 8/2013 | Hirai | 347/68 |
| 8,867,114 B2 * | 10/2014 | Kanno et al. | 359/224.1 |
| 2002/0057041 A1 | 5/2002 | Takeuchi et al. | |
| 2003/0173021 A1 | 9/2003 | Mikami et al. | |
| 2004/0104642 A1 | 6/2004 | Takeuchi et al. | |
| 2004/0136117 A1 | 7/2004 | Kuwajima et al. | |
| 2005/0206050 A1 | 9/2005 | Yoshioka et al. | |
| 2005/0273990 A1 | 12/2005 | Takeuchi et al. | |
| 2006/0113876 A1 | 6/2006 | Ikeda et al. | |
| 2008/0060743 A1 | 3/2008 | Minamikawa et al. | |
| 2009/0122462 A1 | 5/2009 | Suzuki et al. | |
| 2009/0284568 A1 * | 11/2009 | Yazaki | 347/68 |

FOREIGN PATENT DOCUMENTS

| | | |
|---|---|---|
| JP | 2003-332648 | 11/2003 |
| JP | 2005-039176 | 2/2005 |
| JP | 2005-072113 | 3/2005 |
| JP | 2006-060000 A1 | 3/2006 |
| WO | 02/070265 A1 | 9/2002 |

OTHER PUBLICATIONS

Extended European Search Report (Application No. 11786668.1) dated Jun. 23, 2014.

* cited by examiner (1)

(2)

(3)

(4)

(5)

(6)

(7)

(I)

(II)

(III)

(IV)

(V)

(VI)

(VII)

(VIII)

(IX)

(X)

METHOD OF MANUFACTURING PIEZOELECTRIC ELEMENT

BACKGROUND OF THE INVENTION

1. Field of the Invention

The present invention relates to a method of manufacturing a piezoelectric element including a thin fired piezoelectric body having a high flatness degree.

In recent years, there has been demanded a displacement control device which regulates an optical path length or position of the order of submicrons in the fields of optics, a precise machine, semiconductor manufacturing and the like. To answer this demand, there has been advanced the development of a piezoelectric device such as a piezoelectric actuator which utilizes a strain (displacement or deformation) occurring on the basis of a counter piezoelectric effect or the like when an electric field is applied to a piezoelectric body, or a piezoelectric sensor which utilizes the generation of charges (polarization) occurring on the basis of a similar effect when a pressure is applied to the piezoelectric body.

The central core of the piezoelectric device is made by a piezoelectric element in which a piezoelectric body is sandwiched between electrodes. In this element, the piezoelectric body can be prepared by forming a piezoelectric material into a film-like shape by a thin film process and firing the material at a high temperature (hereinafter referred to as the fired piezoelectric body). When a type of a material to be added to the piezoelectric material is appropriately selected, it is possible to obtain the fired piezoelectric body having a high piezoelectric constant and causing a large displacement. Moreover, when the piezoelectric constant is high, a necessity of thinly forming a fired piezoelectric body to obtain predetermined characteristics decreases, and hence a handling performance enhances. On the other hand, the piezoelectric element constituted of the fired piezoelectric body which can obtain the large displacement can be miniaturized and is preferably applied to the piezoelectric device having a power consumption or a response which changes in accordance with a weight thereof, and a product using the device.

2. Description of Related Art

Examples of prior art technical documents concerning the piezoelectric element include Patent Document 1 (JP-A-2001-68751) and Patent Document 2 (JP-A-2006-60000). Patent Document 1 discloses a piezoelectric actuator having a structure in which a piezoelectric element is bonded to a metal plate. Moreover, Patent Document 2 discloses a method of manufacturing a piezoelectric element in which electrodes and a piezoelectric body are laminated on a dummy material and then the dummy material is removed to obtain the piezoelectric element.

SUMMARY OF THE INVENTION

However, in a piezoelectric actuator disclosed in Patent Document 1, when a piezoelectric element is not flat, an area of the piezoelectric element to be bonded to a metal plate varies, and it is difficult to obtain a predetermined displacement. Moreover, for the purpose of preparing a flat piezoelectric element, a flat fired piezoelectric body is required. Moreover, in the method of manufacturing the piezoelectric element disclosed in Patent Document 2, micro warp might be generated in the (fired) piezoelectric body owing to a thickness of an electrode or a type of a dummy material.

Consequently, it is considered that in the piezoelectric element, a flat and thin fired piezoelectric body which does not warp is demanded. However, a piezoelectric material is a material which is noticeably deformed when fired. If the piezoelectric material is thinly formed (to obtain a thin green sheet) and fired at a high temperature, the material is more easily deformed. Therefore, it is difficult to obtain, as a constituent element of the piezoelectric element, the thin fired piezoelectric body which is flat (has a high flatness degree).

On the other hand, when the piezoelectric material is formed to be thick, it is possible to suppress the deformation due to the firing. Therefore, it is also considered that when a thick green sheet is fired and then subjected to processing such as cutting or polishing, the thin fired piezoelectric body can be obtained. However, when the thin fired piezoelectric body is obtained by processing such as the cutting or polishing, much labor and time are required, and productivity deteriorates. Moreover, a processed surface is excessively smooth, and hence the surface has poor close contact properties with another member. When the piezoelectric element including the fired piezoelectric body is incorporated in a piezoelectric device or product, an adhesive might be required. In these respects, the fired piezoelectric body processed after fired unfavorably becomes thin. Furthermore, phase transformation or spontaneous polarization might occur in the fired piezoelectric body by a stress due to the processing, and it is difficult to process the front and back surfaces of the fired piezoelectric body on the same conditions so that the fired piezoelectric body is thinly formed. Therefore, on the basis of the processing conditions which become different, a difference is easily made in crystal orientation degree or spontaneous polarization state before a polarization treatment between the front surface and the back surface of the fired piezoelectric body. In this case, undulation occurs later during the polarization treatment, and the thin fired piezoelectric body having a high flatness degree cannot be obtained after the polarization treatment.

On the other hand, for the purpose of obtaining the thin fired piezoelectric body without depending on the processing after the firing, the piezoelectric material is formed into a film-like shape on a substrate and fired to obtain the fired piezoelectric body. In this case, owing to a difference in lattice constant or thermal expansion between the fired piezoelectric body and the substrate, a difference is still easily made in the crystal orientation degree or crystal configuration between the front surface and the back surface of the fired piezoelectric body. If such a difference is made, the undulation might occur in a case where the fired piezoelectric body is peeled and removed from the substrate or during the polarization treatment performed later. Moreover, it is considered that when even a thin green sheet is fired alone on a setter, the undulation does not easily occur. However, the difference in crystal orientation degree or crystal configuration is easily made between the surface exposed to a firing atmosphere and the surface which comes in contact with the setter. If this difference is made, the undulation similarly easily occurs during the polarization treatment performed later. In any case, it is difficult to obtain the thin fired piezoelectric body having the high flatness degree.

As to the fired piezoelectric body in which the undulation has occurred and which has a low flatness degree, for example, when the fired piezoelectric body is a laminate including one layer or several layers and entirely having a small thickness of 20 μm or less and a potential is applied to the body, a displacement in a thickness direction might increase as much as several times the displacement in a planar direction. The piezoelectric element including such a fired piezoelectric body is not preferable.

In addition, the thin fired piezoelectric body obtained by forming and firing the piezoelectric material has a low strength and, accordingly, has a problem that the body easily breaks during handling.

The present invention has been developed in view of the above situation, and an object thereof is to provide means for obtaining a piezoelectric element including a thin fired piezoelectric body having a high flatness degree. Investigations have been repeated, and it has eventually been found that the above object can be achieved in a manufacturing process of a piezoelectric element in which a piezoelectric material is formed into a thin green sheet (a green sheet A), and a green sheet (a green sheet B) which is several times thicker than the green sheet is integrally superimposed as a reinforcing plate on a portion of the green sheet A other than a portion of the green sheet which becomes a fired piezoelectric body to be obtained later, to obtain a laminate. After the laminate is fired, the reinforcing plate formed by the firing of the green sheet B is removed by processing, to achieve the above object.

That is, first, according to the present invention, there is provided a method of manufacturing a piezoelectric element comprising: a step of preparing a green sheet A including a portion which becomes a fired piezoelectric body later, by use of a piezoelectric material; a step of joining, to at least one surface of the green sheet A, a green sheet B having an opening in a portion facing the portion which becomes the fired piezoelectric body later, followed by firing to obtain the fired piezoelectric body provided with a reinforcing plate to which the reinforcing plate formed owing to the firing of the green sheet B is attached; and a step of forming a film-like electrode in a portion obtained by the firing of the green sheet A in the fired piezoelectric body provided with the reinforcing plate.

The method of manufacturing the piezoelectric element according to the present invention is a method of manufacturing a single-plate piezoelectric element in which electrodes are disposed on both surfaces (main surfaces) of a fired piezoelectric body or a laminate type piezoelectric element in which electrodes are disposed on both of the front and back surfaces (the main surfaces) of a laminate obtained by laminating a plurality of fired piezoelectric bodies and electrodes. The piezoelectric element comprises a fired piezoelectric body having both the surfaces (the main surfaces) constituted of fired surfaces and having less displacement in a thickness direction as compared with a planar direction. In the method of manufacturing the piezoelectric element according to the present invention, the green sheet A (the green sheet) becomes the fired piezoelectric body when fired. The thick green sheet B (the green sheet) is a reinforcing plate for firing which prevents the thin green sheet A (the green sheet) from being deformed during the firing. This green sheet B (the green sheet) joined to the green sheet A (the green sheet) is fired to become the fired piezoelectric body provided with the reinforcing plate. In the fired piezoelectric body provided with the reinforcing plate, the fired reinforcing plate is a portion which has been the green sheet B (the reinforcing plate for firing) before fired. That is, the reinforcing plate is substantially a portion which has been the same green sheet as the green sheet including the portion which becomes the fired piezoelectric body later (a raw ceramic material (preferably the same piezoelectric material as the fired piezoelectric body)).

In the method of manufacturing the piezoelectric element according to the present invention, a thickness T and an in-plane maximum length L of the green sheet A may be determined in consideration of a shrinkage on the basis of the thickness T and the in-plane maximum length L of the fired piezoelectric body of the piezoelectric element to be obtained. When the green sheet is fired at a high temperature, the green sheet shrinks, whereby the thickness T and the in-plane maximum length L of the green sheet A become different from the thickness T and the in-plane maximum length L of the fired piezoelectric body of the piezoelectric element.

In the method of manufacturing the piezoelectric element according to the present invention, the green sheet B is preferably thicker than the green sheet A. Specifically, when the thickness of the green sheet A is, for example, 10 μm, the thickness of the green sheet B exceeds 10 μm, is preferably several tens of micrometers (e.g., from 50 to 90 μm), and may be of the order of hundred micrometers.

In the method of manufacturing the piezoelectric element according to the present invention, the film-like electrode is preferably formed by one process selected from the group of film forming means consisting of a spin coat process, a sputtering process, a dip process, and a non-contact coating process.

In the method of manufacturing the piezoelectric element according to the present invention, to at least one surface of the green sheet A, there is joined the green sheet B having an opening in the portion facing the portion which becomes the fired piezoelectric body later, and in the fired piezoelectric body provided with the reinforcing plate, the reinforcing plate (the portion) formed by the firing is the portion which has been the green sheet B before fired. Therefore, needless to say, the opening is present in the reinforcing plate. The method of manufacturing the piezoelectric element according to the present invention preferably comprises, after the step of obtaining the fired piezoelectric body provided with the reinforcing plate, a step of filling the opening of the reinforcing plate with a resin.

The method of manufacturing the piezoelectric element according to the present invention preferably further comprises, after the step of forming the film-like electrode, a step of joining a peelable peel plate made of a film-like resin to both surfaces or one surface of the fired piezoelectric body portion or the front surface of the electrode by one process selected from the group of film forming means consisting of a spin coat process, a sputtering process, a dip process and a non-contact coating process.

In the method of manufacturing the piezoelectric element according to the present invention, the peel plate is preferably peelable by irradiation with light or heating.

The method of manufacturing the piezoelectric element according to the present invention preferably further comprises, after the step of forming the film-like electrode, a step of removing, from the fired piezoelectric body provided with the reinforcing plate, a portion other than the fired piezoelectric body portion provided with the film-like electrode by cutting on the basis of one means selected from the group of cutting means consisting of laser, etching, blast, dicer and mechanical processing, to obtain the piezoelectric element.

Next, according to the present invention, there is provided a fired piezoelectric body in which crystals (of the fired piezoelectric body) are not oriented.

In the fired piezoelectric body according to the present invention, a lattice strain amount calculated from an X-ray diffraction profile by Hall process is preferably small.

The fired piezoelectric body according to the present invention (the piezoelectric body) has tetragonal crystals, and (in this case, in addition to the small strain amount,) a ratio $I_{002}/I_{200}$ between an intensity $I_{002}$ of a (002) face and an intensity $I_{200}$ of a (200) face in the X-ray diffraction profile is preferably from 1.5 to 5.0. In the fired piezoelectric body according to the present invention, the ratio $I_{002}/I_{200}$ is especially preferably from 1.5 to 3.0. In this range, any crack is not generated during continuous driving.

In the fired piezoelectric body according to the present invention, one surface and the other surface (of the fired piezoelectric body) preferably have substantially the same ratio $I_{002}/I_{200}$ between the intensity $I_{002}$ of the (002) face and the intensity $I_{200}$ of the (200) face in the X-ray diffraction profile. This means that there is not any difference in crystal orientation degree, crystal configuration and spontaneous polarization state between the one surface and the other surface. It is to be noted that the substantially the same ratio $I_{002}/I_{200}$ indicates a case where the ratios are the same up to a decimal place. In such a state, a displacement amount in the planar direction during the driving can especially be set to be larger than a displacement amount in a direction vertical to the plane.

Moreover, there is provided a piezoelectric element comprising any of the above fired piezoelectric bodies, and film-like electrodes formed on both surfaces constituted of fired surfaces of the fired piezoelectric body.

Furthermore, there is provided a piezoelectric element comprising a fired piezoelectric body having a multilayer structure, and film-like electrodes formed on both surfaces constituted of fired surfaces of the fired piezoelectric body, wherein the film-like electrodes are bonding layers.

The method of manufacturing the piezoelectric element according to the present invention comprises the step of preparing the green sheet A including the portion which becomes the fired piezoelectric body later, by use of the piezoelectric material; the step of joining, to at least one surface of the green sheet A, the green sheet B having the opening in the portion facing the portion which becomes the fired piezoelectric body later, followed by firing to obtain the fired piezoelectric body provided with the reinforcing plate to which the reinforcing plate formed owing to the firing of the green sheet B is attached; and the step of forming the film-like electrode in the portion obtained by the firing of the green sheet A in the fired piezoelectric body provided with the reinforcing plate. Therefore, the green sheet A and the green sheet B (the reinforcing plate for firing) are simultaneously fired, and it is possible to suppress the deformation of the green sheet A including the portion which becomes the fired piezoelectric body, during the firing. In consequence, needless to say, the fired piezoelectric body is not easily deformed during the firing, and it is possible to obtain the piezoelectric element including the thin fired piezoelectric body having the high flatness degree. Moreover, after the firing, the reinforcing plate (the portion which has been the green sheet B) is attached, whereby handling is facilitated, and a problem of breaking does not easily occur in the fired piezoelectric body.

In the method of manufacturing the piezoelectric element according to the present invention, when the piezoelectric element including the thin fired piezoelectric body having the high flatness degree is obtained, the fired piezoelectric body is not formed to be thin by the processing after the firing. Therefore, as compared with a case where the processing is performed, labor and time can be minimized, to achieve a high productivity. Moreover, the front surface of the fired piezoelectric body of the piezoelectric element obtained by, the method of manufacturing the piezoelectric element according to the present invention is not the processed surface but is the non-processed fired surface, and hence has satisfactory bonding properties to another member. Furthermore, since the body is not formed to be thin by the processing, phase transformation or spontaneous polarization on the basis of a processing stress does not occur in the fired piezoelectric body, and there is less difference in crystal orientation degree or spontaneous polarization state before the polarization treatment between the front surface and the back surface of the fired piezoelectric body. Therefore, even when the polarization treatment is performed later, undulation does not easily occur, and it is possible to obtain the piezoelectric element including the thin fired piezoelectric body having the high flatness degree.

In the method of manufacturing the piezoelectric element according to the present invention, when the piezoelectric element including the thin fired piezoelectric body having the high flatness degree is obtained, the piezoelectric material is formed into the film-like shape on the substrate, or the thin green sheet is directly disposed on the setter, and the firing is not performed. The thick green sheet B having the opening in the portion facing the portion which becomes the fired piezoelectric body is joined to the thin green sheet A, followed by firing. Therefore, in a state where any stress is not applied to the portion which becomes the fired piezoelectric body, the firing is performed. In consequence, any difference is not easily made in crystal orientation degree or crystal configuration between the front surface and the back surface of the obtained fired piezoelectric body. When the polarization treatment is performed later, any undulation does not easily occur. Therefore, it is possible to obtain the piezoelectric element including the thin fired piezoelectric body having the high flatness degree.

In a preferable configuration of the method of manufacturing the piezoelectric element according to the present invention, the green sheet B is thicker than the green sheet A, and hence the above effect is easily obtained. That is, it is possible to securely suppress the deformation of the green sheet A including the portion which becomes the fired piezoelectric body, during the firing. In consequence, it is possible to easily obtain the piezoelectric element including the thin fired piezoelectric body having the high flatness degree, which has heretofore been difficult to obtain.

In the piezoelectric element obtained by the method of manufacturing the piezoelectric element according to the present invention, any undulation does not occur in the fired piezoelectric body. Therefore, even in a case where the fired piezoelectric body is, for example, a laminate including one layer or several layers and entirely having a small thickness of 20 µm or less, the piezoelectric element preferably has displacements aligned in one direction when a potential is applied thereto.

In the fired piezoelectric body according to the present invention, the crystals of the piezoelectric body are not oriented, and hence the body has a high intensity.

In a preferable configuration of the fired piezoelectric body according to the present invention, both surfaces thereof have almost the same surface roughness. Since the body is not mechanically processed, the body does not have any micro crack, and has an excellent durability. The front and back surfaces of the body do not have any anisotropic properties, and hence the displacement in the planar direction is easily achieved.

The piezoelectric element according to the present invention includes the fired piezoelectric body according to the present invention as a constituent element, and produces an effect of really developing the above effects obtained by the fired piezoelectric body according to the present invention.

DESCRIPTION OF REFERENCE NUMERALS

Figure 1:
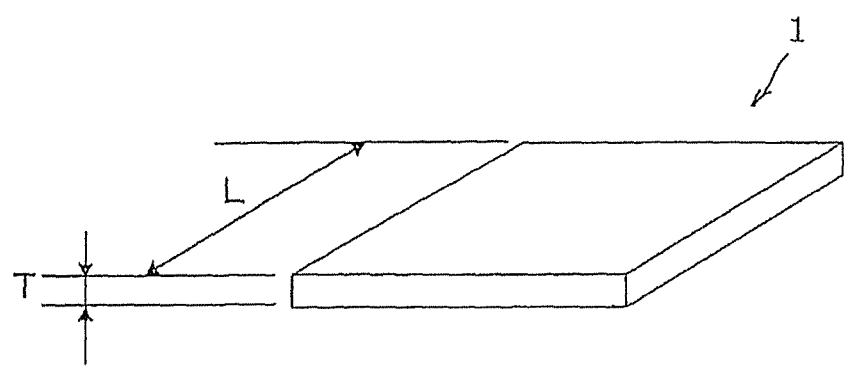
FIG. 1 is a perspective view showing an example of a fired piezoelectric body.

1: fired piezoelectric body, 10 and 100: piezoelectric element, 21: green sheet A (green sheet), 22: green sheet B (green sheet), 23: fired piezoelectric body provided with reinforcing plate, 31, 131 and 231: resist, 33: electrode, 34: resin, 35: peel plate, 36: electrode, 700: piezoelectric element, 701: fired piezoelectric body, 711: through hole, 723: fired piezoelectric body provided with reinforcing plate, 733 and 734: electrode, 736: peel plate, 741: resist, 744: resin, 761: tray, 800: piezoelectric element, 801: fired piezoelectric body, 823: fired piezoelectric body provided with reinforcing plate, 833 and 834: electrode, 836: resin, 841, 842 and 843: resist, 844: resin, 845: through hole, and 846: terminal electrode.

DETAILED DESCRIPTION OF THE INVENTION

Hereinafter, embodiments of the present invention will be described appropriately with reference to the drawings, but the present invention should not be limited to these embodiments when interpreted, and various changes, modifications, and improvements can be added thereto on the basis of the knowledge of a person skilled in the art without departing from the scope of the present invention. For example, the drawings show the preferable embodiments of the present invention, but the present invention is not limited to the configurations or information shown in the drawings. When the present invention is carried out or verified, means similar or equivalent to those described in the present description can be applied, but preferable means are described as follows.

It is to be noted that in a method of manufacturing a piezoelectric element according to the present invention described later, a plurality of piezoelectric elements are simultaneously prepared (multiple elements are manufactured). The drawing is a schematic diagram drawn so as to facilitate the understanding of a manufacturing process, and needless to say, it should be understood that thicknesses of a fired piezoelectric body and electrodes are not drawn in a preferable state.

The method of manufacturing the piezoelectric element according to the present invention is a method to obtain a piezoelectric element including a thin fired piezoelectric body having a high flatness degree. First, the fired piezoelectric body will be described. A fired piezoelectric body 1 shown in FIG. 1 is a single-layer piezoelectric body. The fired piezoelectric body 1 has a rectangular planar shape, but there is not any special restriction on the outer shape of the fired piezoelectric body. When productivity is taken into consideration, the outer shape obtained by mechanical processing is preferable, and is preferably a shape made of straight lines, for example, a polygonal shape, and especially a rectangular shape.

The piezoelectric element obtained by the method of manufacturing the piezoelectric element according to the present invention is not shown, but is obtained by forming film-like electrodes on both surfaces constituted of fired surfaces of the fired piezoelectric body 1 shown in FIG. 1. In the piezoelectric element, it is possible to employ a configuration using the fired piezoelectric body having a multilayer structure and including the film-like electrodes formed on both the surfaces constituted of the fired surfaces of the body, and a film-like electrode formed on the surface between single layers. That is, a laminate structure including an electrode, a piezoelectric body, an electrode, a piezoelectric body and an electrode may repeatedly be formed. In this case, as to the number of laminates, the number of the piezoelectric bodies is preferably three, the number of the electrodes is preferably four, and these numbers may be exceeded.

Next, an embodiment of the method of manufacturing the piezoelectric element according to the present invention will be described. In the method of manufacturing the fired piezoelectric body according to the present invention, a green sheet 21 (a green sheet A) is prepared by using a piezoelectric material (see FIG. 2). The green sheet 21 (the green sheet A) includes a portion which becomes the fired piezoelectric body later. For example, a binder, a solvent, a dispersant, a plasticizer and the like are added to and mixed with a ceramic powder of lead titanate zirconate or the like, to prepare a slurry. After a defoaming treatment of this slurry, the green sheet having the above thickness is prepared by a process such as a reverse roll coater process or a doctor blade process. Afterward, by a process such as punching by use of a mold or laser processing, it is possible to obtain the green sheet 21 having a desirable size.

Moreover, a green sheet 22 (a green sheet B) which is thicker than the green sheet 21 is separately prepared. The green sheet 22 (the green sheet B) is a reinforcing plate for firing. For example, in the same manner as in the green sheet 21, a binder, a solvent, a dispersant, a plasticizer and the like are added to and mixed with the ceramic powder of lead titanate zirconate or the like, to prepare a slurry. After a defoaming treatment of this slurry, the green sheet having a desirable thickness is prepared by a process such as a reverse roll coater process or a doctor blade process. Afterward, by a process such as punching by use of a mold or laser processing, the green sheet is formed into an outer shape which is equal to or larger than the green sheet 21 which becomes the fired piezoelectric body later, and an opening is made in a portion facing the portion which becomes the fired piezoelectric body later, whereby it is possible to obtain the green sheet 22.

Figure 2:
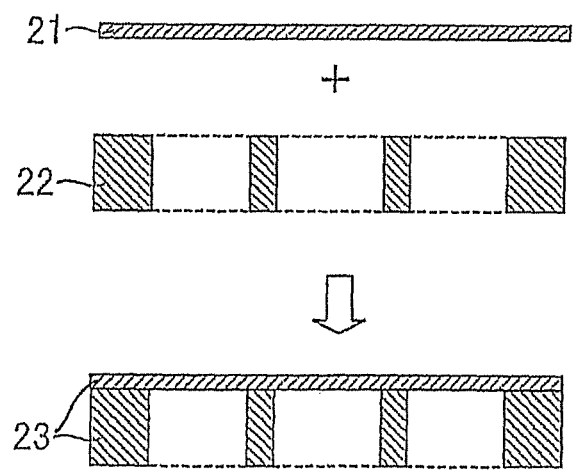
FIG. 2 is a sectional view showing an embodiment of a method of manufacturing a piezoelectric element according to the present invention.
Figure 3A:
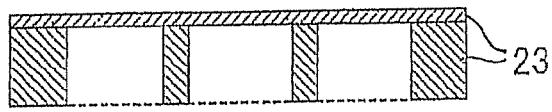
FIG. 3A is a sectional view showing the embodiment of the method of manufacturing the piezoelectric element according to the present invention, and is a diagram showing steps (1) to (7).
Figure 3A:
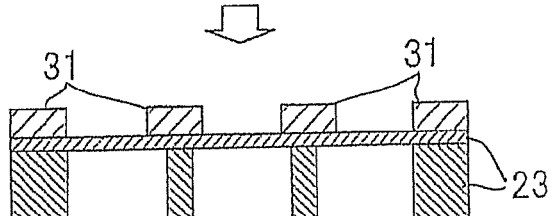
Figure 3A:
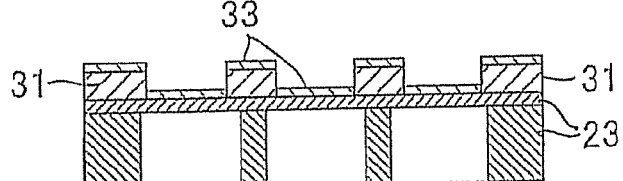
Figure 3A:
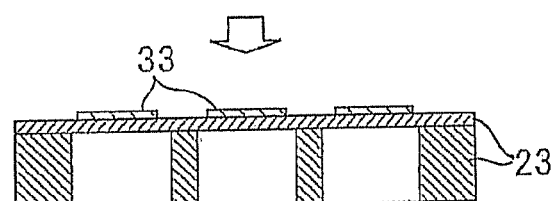
Figure 3A:
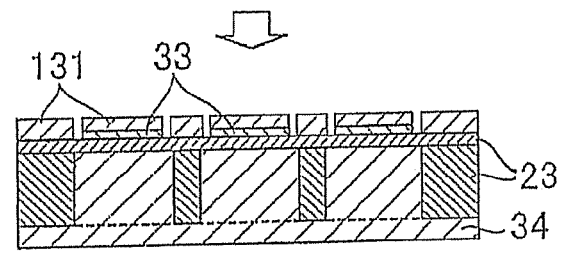
Figure 3A:
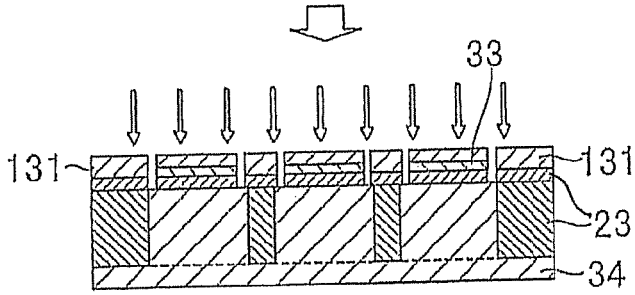
Figure 3A:
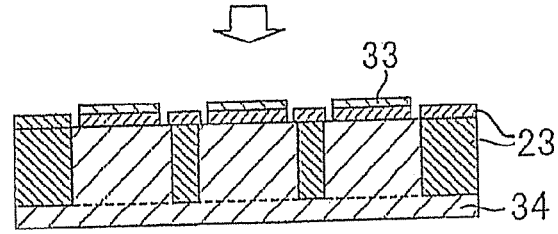

Next, the green sheet 21 is joined to the green sheet 22, followed by firing at an appropriate temperature in a range from 800 to 1600° C. on the basis of a piezoelectric material for use, to obtain a fired piezoelectric body 23 provided with a reinforcing plate (see FIG. 2 and step (1) of FIG. 3A). That is, the fired piezoelectric body 23 provided with the reinforcing plate is obtained by the firing of the green sheet 21 including the portion which becomes the fired piezoelectric body later, and the green sheet 22 which is the reinforcing plate for firing. A portion obtained by the firing of the green sheet 22 will be referred to as the reinforcing plate even after the firing, and the reinforcing plate in the fired piezoelectric body 23 provided with the reinforcing plate indicates this portion.

Next, resist patterning is performed to form film-like electrodes (see step (2) of FIG. 3A). That is, for example, by an exposure process, there is coated, with a resist 31, the surface of the fired piezoelectric body 23 provided with the reinforcing plate on which the reinforcing plate (the portion obtained by firing the green sheet 22 (the green sheet B)) is not disposed, excluding a portion which becomes an electrode later. Then, for example, by a sputtering treatment, a film-like electrode 33 made of a conductive material (e.g., gold) is formed (see step (3) of FIG. 3A). Afterward, when the resist 31 is removed, for example, with a remover, the only film-like electrodes 33 remain (see step (4) of FIG. 3A).

Next, for the purpose of individually separating portions which become piezoelectric elements later, resist patterning is performed, and the fired piezoelectric body 23 provided with the reinforcing plate is further reinforced (see step (5) of FIG. 3R). That is, for example, by an exposure process, there is coated, with a resist 131, the portion of the fired piezoelectric body 23 provided with the reinforcing plate excluding a portion to be cut. Moreover, the fired piezoelectric body 23 provided with the reinforcing plate on a side provided with the reinforcing plate (the portion obtained by the firing of the green sheet 22 (the green sheet B)) is filled with, for example, a resin 34. The body may be filled with the resin 34 and then coated with the resist 131. Then, for example, by a wet etching treatment or a blast treatment, part of the fired piezoelectric body 23 provided with the reinforcing plate is cut, and the portions which become the piezoelectric elements later are individually separated (see step (6) of FIG. 3A). Afterward, the resist 131 is removed, for example, with a remover (see step (7) of FIG. 3A).

Figure 3B:
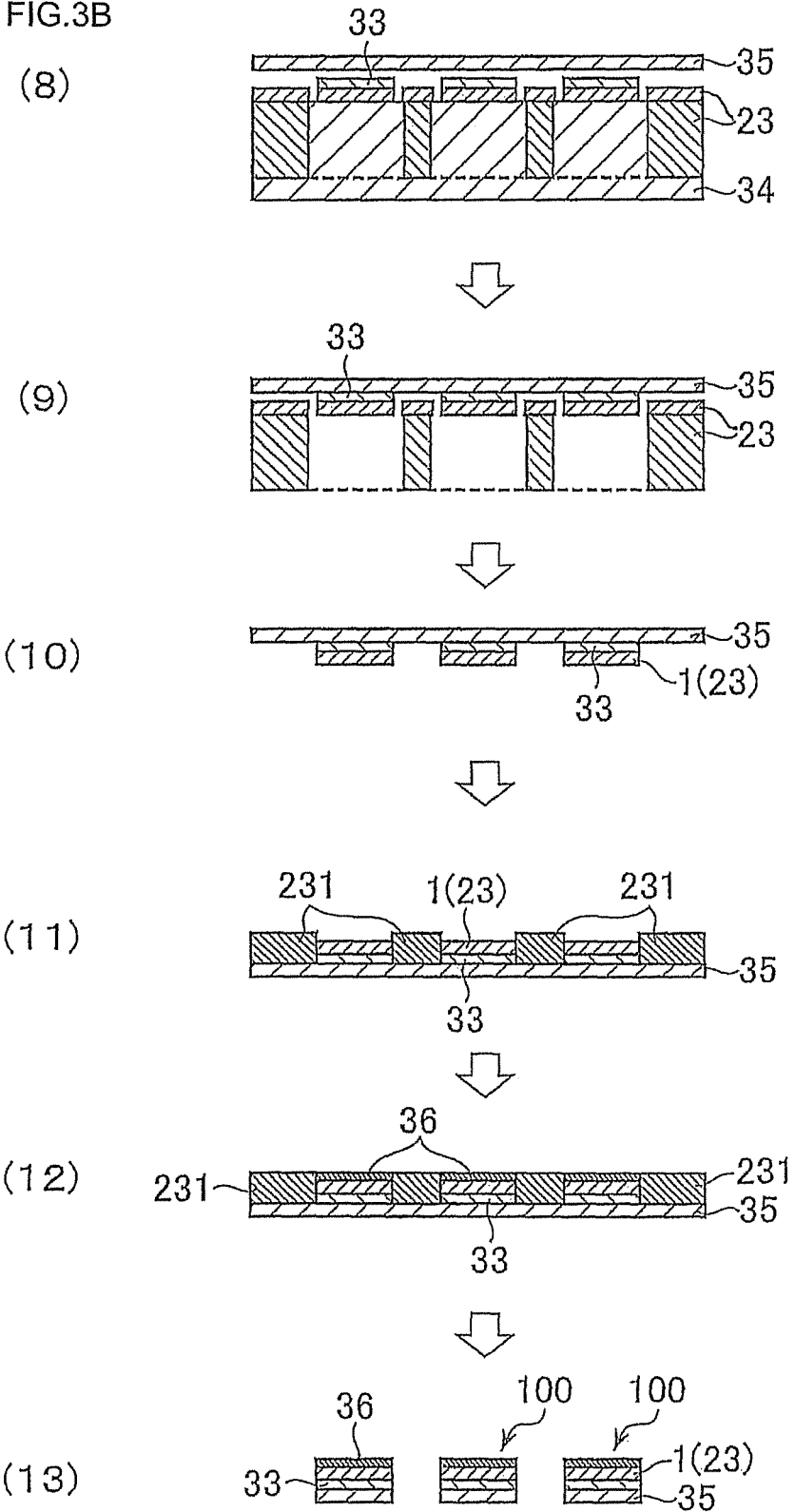
FIG. 3B is a sectional view showing the embodiment of the method of manufacturing the piezoelectric element according to the present invention, and is a diagram showing steps (8) to (13) following the steps (1) to (7) of FIG. 3A.

Next, a peel plate 35 separately prepared is integrally joined (see step (8) of FIG. 3B). As the peel plate 35, an adhesive film can be used. This may be peeled and removed later. Then, the resin 34 is removed with the remover or the like (see step (9) of FIG. 3B). Furthermore, when a portion of the fired piezoelectric body 23 provided with the reinforcing plate in which the electrodes 33 are not disposed is removed (see step (10) of FIG. 3B), the peel plate 35 provided with the electrodes 33 (lower electrodes) and the fired piezoelectric bodies 1 (which are not provided with any reinforcing plate) is obtained (the step (10) of FIG. 3B is drawn upside down, unlike step (11) and the subsequent steps).

Next, resist patterning is performed to form upper electrodes (see the step (11) of FIG. 3B). That is, for example, by the exposure process, the surface of the peel plate 35 which is not provided with the fired piezoelectric body 1 is coated with a resist 231. Then, for example, by the sputtering treatment, electrodes 36 (upper electrodes) made of a conductive material (e.g., gold) are formed (see step (12) of FIG. 3B). Next, when the resist 231 is removed, for example, with the remover, the only film-like electrodes 36 remain.

Afterward, when the peel plate 35 is cut, individually separated piezoelectric elements 100 are obtained (see step (13) of FIG. 3B). Each of the piezoelectric elements 100 includes the fired piezoelectric body 1 and the electrodes 33 and 36 disposed on both surfaces of the body. Here, the peel plate 35 may be peeled from the piezoelectric element 100 as described above in accordance with a use application. When the peel plate is peeled, as the peel plate 35, it is possible to preferably use a sheet peelable by heat or a sheet peelable by UV light.

It is to be noted that when the piezoelectric body has two or more layers, first, an electrode layer which becomes an internal electrode is separately formed on a green sheet by a screen printing process or the like. Then, the green sheet is joined to the green sheet 21 described above (see FIG. 2) so that an electrode forming surface is sandwiched between the sheets, to prepare a laminate green sheet (when the piezoelectric body has three or more layers, this step is repeated). Afterward, the laminate green sheet is joined to the green sheet 22 described above (see FIG. 2). Then, it is possible to obtain a multilayered piezoelectric body through the steps shown in FIG. 3A. It is to be noted that the green sheet 21 may be provided with a through hole for achieving conduction with the internal electrode.

The embodiment of the method of manufacturing the piezoelectric element according to the present invention has been described above with reference to FIG. 2, FIG. 3A and FIG. 3B. Furthermore, another embodiment will be described with reference to FIG. 7A and FIG. 7B. First, in the same manner as in the above method of manufacturing the piezoelectric element, a fired piezoelectric body 723 provided with a reinforcing plate is prepared (see step (I) of FIG. 7A). Next, through holes 711 are formed in the fired piezoelectric body 723 provided with the reinforcing plate, for example, by use of laser (see step (II) of FIG. 7A). When the fired piezoelectric body 723 provided with the reinforcing plate is prepared, punch forming may be performed by using a mold. In this case, a green sheet A is joined to a green sheet B, and then the punch forming is performed by using the mold. Afterward, in a state where the through holes are made, the sheets are fired at an appropriate temperature in a range from 800 to 1600° C. on the basis of a piezoelectric material for use, to obtain the fired piezoelectric body 723 provided with the reinforcing plate.

Figure 7A:
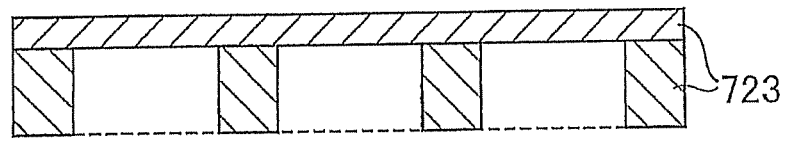
FIG. 7A is a sectional view showing another embodiment of the method of manufacturing the piezoelectric element according to the present invention, and is a diagram showing steps (I) to (VI).
Figure 7A:
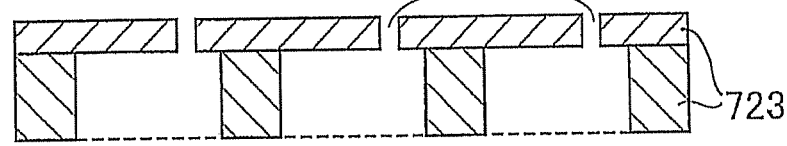
Figure 7A:
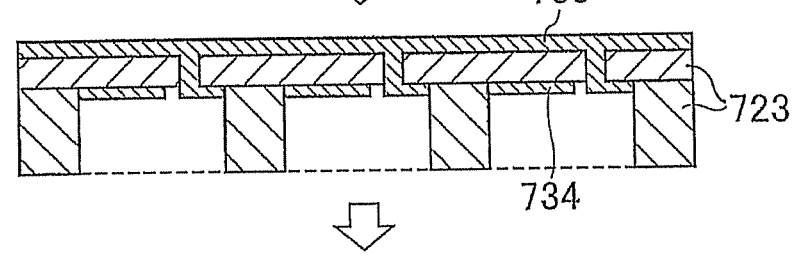
Figure 7A:
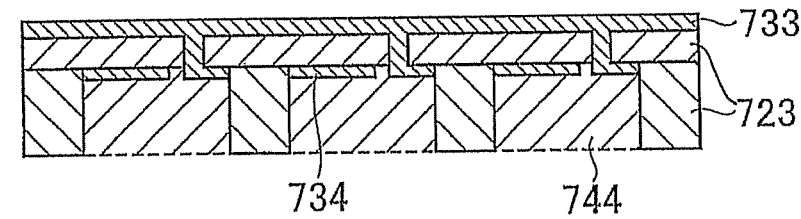
Figure 7A:
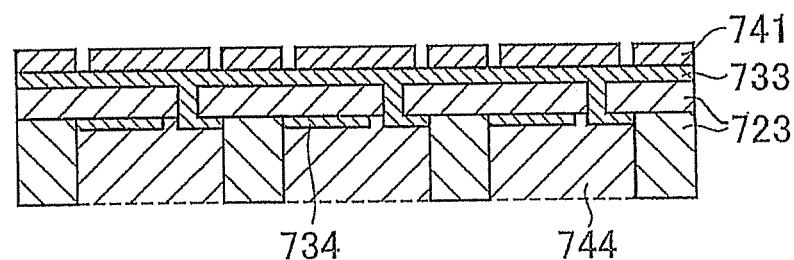
Figure 7A:
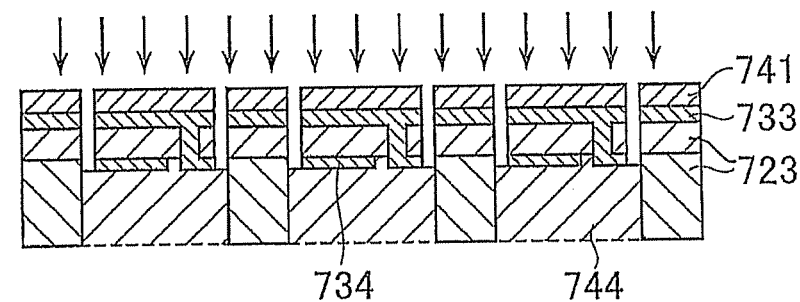

Then, for example, resist patterning is performed, and both surfaces of the fired piezoelectric body 723 provided with the reinforcing plate and the through holes 711, as well as the through holes 711, are coated with a paste (a conductive material (e.g., gold)) by a spin coat process, to form film-like electrodes 733 and 734 made of the conductive material (e.g., gold) (see step (III) of FIG. 7A). The electrodes 733 and 734 can be formed also by performing a sputtering treatment. The patterning may be performed by laser processing.

Next, the fired piezoelectric body 723 provided with the reinforcing plate is further reinforced, and the resist patterning is performed to individually separate portions which become piezoelectric elements later. That is, on the side of the fired piezoelectric body 723 provided with the reinforcing plate on which the reinforcing plate is disposed (in a portion where the reinforcing plate has been fired), the body is filled with a resin 744 (see step (IV) of FIG. 7A). For example, by an exposure process, a portion of the fired piezoelectric body 723 provided with the reinforcing plate excluding a portion to be cut is coated with a resist 741 (see step (V) of FIG. 7A). The body may be coated with the resist 741 and then filled with the resin 744. Then, for example, by a wet etching treatment or a blast treatment, part of the fired piezoelectric body 723 provided with the reinforcing plate is cut to individually separate the portions which become the piezoelectric elements later (see step (VI) of FIG. 7A).

Figure 7B:
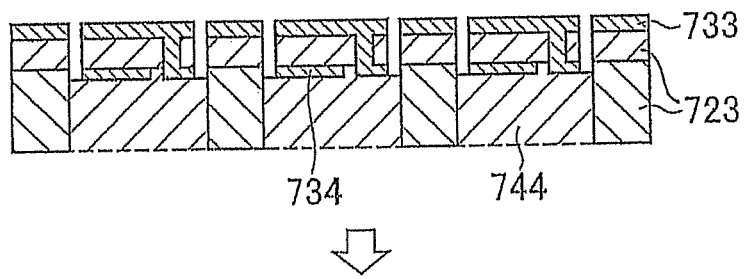
FIG. 7B is a sectional view showing the embodiment of the method of manufacturing the piezoelectric element according to the present invention, and is a diagram showing steps (VII) to (X) following the steps (I) to (VI) of FIG. 7A.
Figure 7B:
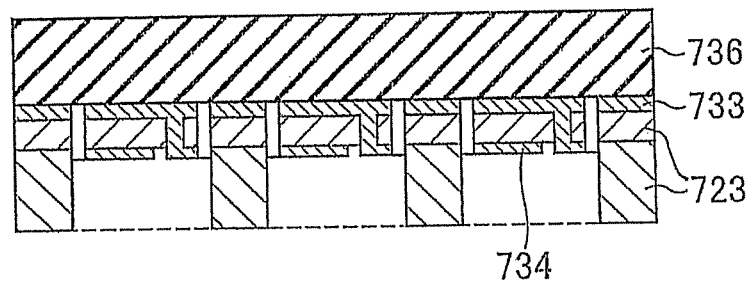
Figure 7B:
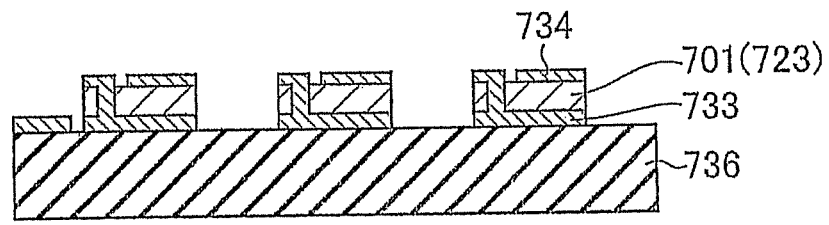
Figure 7B:
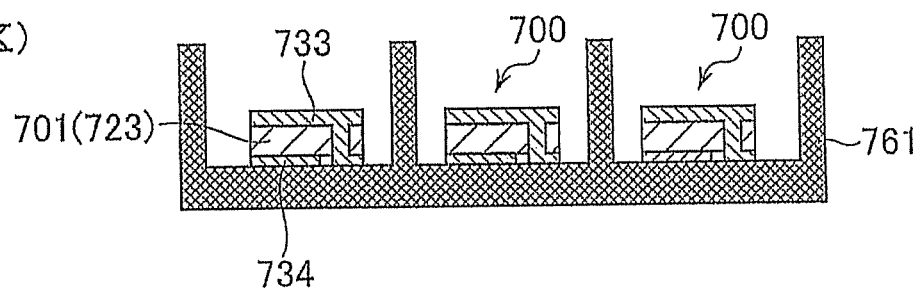

Afterward, the resist 741 is removed, for example, with a remover (see step (VII) of FIG. 7B), and then, the resin 744 is removed with the remover or the like. Furthermore, in the fired piezoelectric body 723 provided with the reinforcing plate, a peel plate 736 is attached only to the portions which become the piezoelectric elements later (see step (VIII) of FIG. 7B), to separate and remove the portions which become the piezoelectric elements (see step (IX) of FIG. 7B). In FIG. 7A and FIG. 7B, unlike the other steps, the only step (IX) is shown upside down, and the portions which become the piezoelectric elements later are separated and are individually present on one surface of the peel plate 736. The portion which becomes the piezoelectric element later includes a fired piezoelectric body (701) obtained by removing a reinforcing plate portion and the like from the fired piezoelectric body 723 provided with the reinforcing plate, and the electrodes 733 and 734. As the peel plate 736, there can preferably be used a plate which is made of a foamed material and from which an adhesive force is eliminated when heat is applied thereto. Moreover, as the peel plate 736, for example, a UV tape can be used.

Next, when the peel plate 736 is removed, individually separated piezoelectric elements 700 can be obtained. In a case where as the peel plate 736, there is used the plate from which the adhesive force is eliminated when the heat is applied thereto, the plate may be heated at a peel temperature or higher. When the UV tape is used as the peel plate 736, the peel plate 736 is irradiated with UV light, whereby the peel plate is removed from the piezoelectric element 700. As described above, the obtained piezoelectric element 700 includes the fired piezoelectric body 701 (which are not provided with any reinforcing plate), and the electrodes 733 and 734. Afterward, when a heat treatment is required, the piezoelectric elements 700 are moved to a tray 761, whereby the heat treatment of the elements can separately be performed (see step (X) of FIG. 7B).

The embodiment of the method of manufacturing the piezoelectric element according to the present invention has been described above with reference to FIG. 7A and FIG. 7B. Furthermore, still another embodiment will be described with reference to FIG. 8A and FIG. 8B. First, in the same manner as in the above method of manufacturing the piezoelectric element, a fired piezoelectric body 823 provided with a reinforcing plate is prepared (see step (a) of FIG. 8A). Next, the body is coated with a paste (a conductive material (e.g., gold)) by a spin coat process, to form film-like electrodes 833 and 834 made of the conductive material (e.g., gold) on both surfaces of the fired piezoelectric body 823 provided with the reinforcing plate (excluding a reinforcing plate portion)(see step (b) of FIG. 8A). The electrodes 833 and 834 can be formed by performing a sputtering treatment.

Then, resist patterning is performed to individually separate the electrodes 833 and 834 for each portion which becomes the piezoelectric element later. That is, for example, by an exposure process, portions of the electrodes 833 and 834 to be left are coated with resists 841 and 842, respectively (see step (c) of FIG. 8A). The portion which becomes the piezoelectric element later mainly includes a fired piezoelectric body (801) obtained by removing the reinforcing plate portion and the like from the fired piezoelectric body 823 provided with the reinforcing plate (see step (j) of FIG. 8B (described later)), and the electrodes 833 and 834. Afterward, a portion other than the electrodes 833 and 834 to be left is removed, for example, by a wet etching treatment or a blast treatment (see step (d) of FIG. 8A). When the conductive material is, for example, gold (Au), the wet etching treatment can be performed by immersing the body into an aqueous solution containing potassium iodide or aluminum iodide as a main component.

Next, the fired piezoelectric body 823 provided with the reinforcing plate is further reinforced, and resist patterning is also performed to cut part of the fired piezoelectric body 823 provided with the reinforcing plate. That is, the fired piezoelectric body 823 provided with the reinforcing plate is filled with a resin 844 on the side of the body on which the reinforcing plate is disposed. Moreover, for example, by an exposure process, a portion of the fired piezoelectric body 823 provided with the reinforcing plate excluding a portion to be cut is coated with a resist 843 (see step (e) of FIG. 8A). The body may be coated with the resist 843 and then filled with the resin 844. Moreover, in place of the coating with the resist 843, a dry resist film may be attached. Here, if the resin 844 expands, a stress of the filled resin 844 to the fired piezoelectric body 823 provided with the reinforcing plate increases, whereby the fired piezoelectric body 823 provided with the reinforcing plate might unfavorably break. To prevent this problem, as the resin 844, a resin which is soluble in the aqueous solution is preferably used. For example, an unexposed negative resist or the like can be used. When such a resin is used, the resin has an excellent solubility in an aqueous solution of acid or alkali, a solvent or the like, and hence the resin is prevented from being expanded.

Figure 8A:
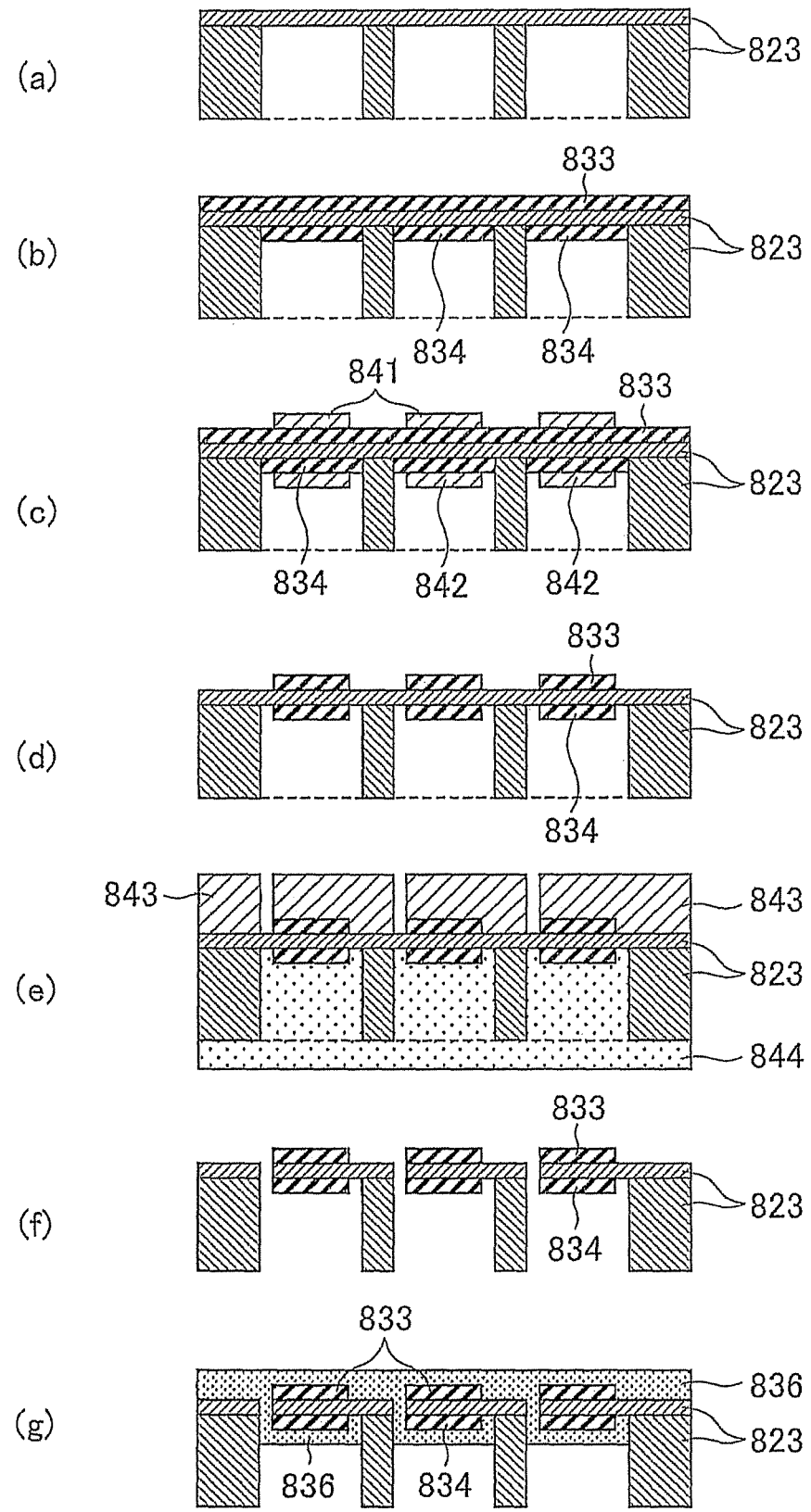
FIG. 8A is a sectional view showing still another embodiment of the method of manufacturing the piezoelectric element according to the present invention, and is a diagram showing steps (a) to (g).

Then, part of the fired piezoelectric body 823 provided with the reinforcing plate is cut, for example, by a wet etching treatment or a blast treatment (see step (f) of FIG. 8A). The cut part corresponds to one side surface of the portion which becomes the piezoelectric element later (see the step (f) of FIG. 8A and the step (j) of FIG. 8B (described later)). In this stage, however, the reinforcing plate is not cut from the fired piezoelectric body 823 provided with the reinforcing plate, but remains. Moreover, FIG. 8A shows a section, and hence in the step (f) of FIG. 8A, the portion which becomes the piezoelectric element later seems to be separated. However, the portions which become the piezoelectric elements later are connected to each other via a portion of the fired piezoelectric body 823 provided with the reinforcing plate which is not cut, and the portions are not individually separated. Afterward, the resin 844 and the resist 843 are removed with a remover or the like.

Next, both the surfaces of the fired piezoelectric body 823 provided with the reinforcing plate are coated with a resin 836 to cover all the portions which become the piezoelectric elements later (see step (g) of FIG. 8A). The resin 836 becomes a protective film later which protects the piezoelectric element from the periphery thereof, to prevent particles from adhering and contribute to the stable driving of the piezoelectric element even in a high-temperature high-humidity environment. Then, the patterning of the resin 836 is performed. That is, the resin 836 is provided with through holes 845 connected to the electrodes 833 from the outside (see step (h) of FIG. 8B). When a photosensitive resin (a photoresist) is used as the resin 836, this patterning can be performed by exposure or development, and hence manufacturing cost can be reduced. Afterward, the through holes 845 are, for example, plated, to form terminal electrodes 846 (see step (i) of FIG. 8B).

Figure 8B:
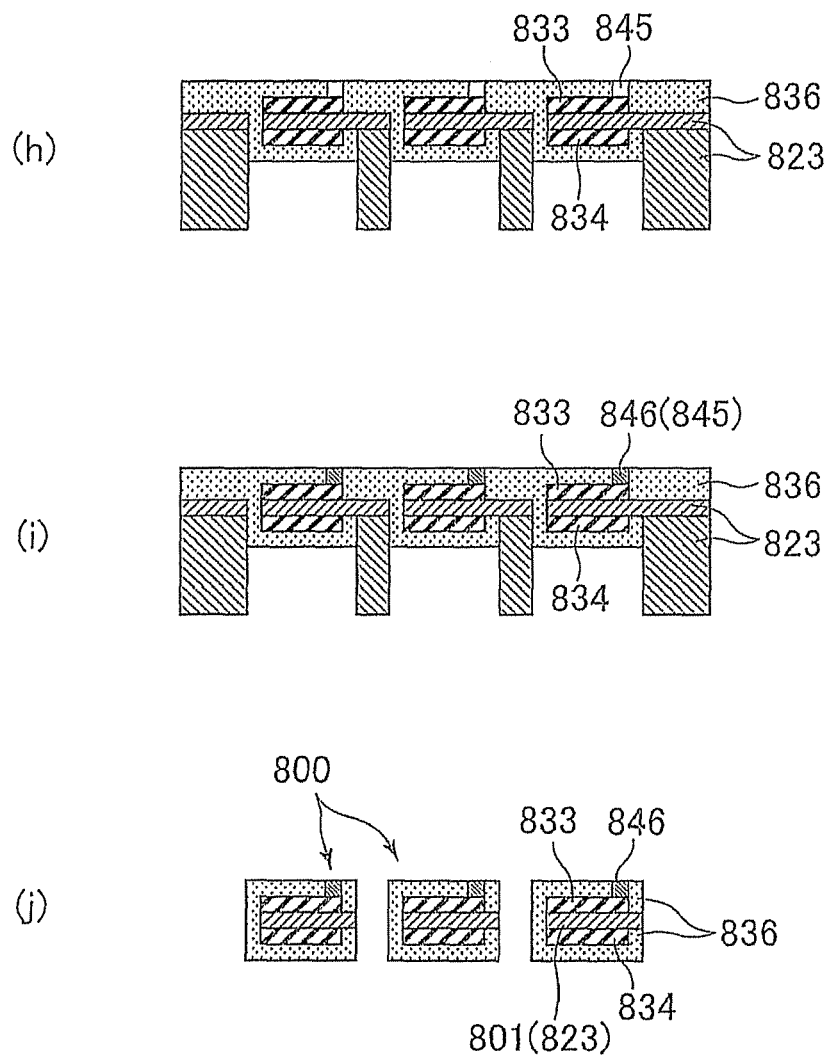
FIG. 8B is a sectional view showing the embodiment of the method of manufacturing the piezoelectric element according to the present invention, and is a diagram showing steps (h) to (j) following the steps (a) to (g) of FIG. 8A.

Then, when the unnecessary fired piezoelectric body 823 provided with the reinforcing plate (especially the reinforcing plate portion) and the unnecessary resin 836 are cut and removed, for example, by using a laser processor, dicer or the like, individually separated piezoelectric elements 800 are obtained (see the step (j) of FIG. 8B). Each of the piezoelectric elements 800 mainly includes the fired piezoelectric body 801 (which is not provided with any reinforcing plate), and the electrodes 833 and 834 as described above, and the piezoelectric element is covered with the resin 836 which is the protective film and is provided with the terminal electrode 846.

Next, a material for use in the piezoelectric element will be described. There is not any special restriction on the material (the piezoelectric material) of the fired piezoelectric body (the green sheet A) as long as the material causes an electric field induced strain such as a piezoelectric effect or an electrostrictive effect. A semiconductor ceramic material, a ferroelectric ceramic material or an anti-ferroelectric ceramic material can be used, and may appropriately selectively be employed in accordance with a use application. Moreover, a material which requires or does not require a polarization treatment may be used.

Specifically, examples of a preferable piezoelectric material include lead zirconate, lead titanate, lead magnesium niobate, lead nickel niobate, lead nickel tantalate, lead zinc niobate, lead manganese niobate, lead antimony stannate, lead antimony niobate, lead ytterbium niobate, lead manganese tungstate, lead cobalt niobate, lead magnesium tungstate, lead magnesium tantalate, barium titanate, sodium bismuth titanate, bismuth neodymium titanate (BNT), potassium sodium niobate, strontium bismuth tantalate, copper tungsten barium, bismuth ferrate, and a composite oxide of two or more of them. For these materials, an oxide of a rare earth element, calcium, strontium, molybdenum, tungsten, barium, niobium, zinc, nickel, manganese, cadmium, chromium, cobalt, antimony, iron, tantalum, lithium, bismuth, tin, copper or the like may be added or substituted. Among these materials, a material obtained by substituting part of lead by strontium and substituting part of zirconium and/or titanium by niobium in a composite oxide of lead zirconate or lead titanate can preferably develop high material characteristics. A material obtained by adding, to the above material, lithium bismuthate, lithium borate, lithium carbonate, lead germania or the like can further preferably develop high material characteristics while realizing the firing of the piezoelectric body at a low temperature.

For example, a piezoelectric material having a composition represented by a predetermined formula and containing (Pb, Sr)(Zr, Ti, Nb)O$_3$ as a main component can be prepared as follows. First, a simple substance containing an element such as Pb, Sr, Nb, Zr or Ti, an oxide of these elements (e.g., PbO, Pb$_3$O$_4$, Nb$_2$O$_5$, TiO$_2$ or ZrO$_2$), a carbonate of these elements (e.g., SrCO$_3$), a compound containing a plurality of these elements and the like are mixed, for example, by using a ball mill, an attritor, a bead mill or the like so that a content of the elements of Pb, Sr, Nb, Zr and Ti is a desirable ratio represented by formula (1), to prepare a mixture. An average particle diameter of the mixture is preferably 1 μm or less and further preferably 0.5 μm or less, which enables uniform mixing. When the prepared mixture is calcinated at 750° C. to 1300° C., it is possible to obtain a piezoelectric ceramic composition.

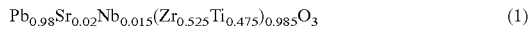

$$Pb_{0.98}Sr_{0.02}Nb_{0.015}(Zr_{0.525}Ti_{0.475})_{0.985}O_3 \quad (1)$$

A ratio of an intensity of the most intense diffraction line of a perovskite phase with respect to an intensity of the most intense diffraction line of a pyrochlore phase in the diffraction intensity of the obtained piezoelectric ceramic composition by an X-ray diffraction device is preferably 5% or less, and further preferably 2% or less.

The above piezoelectric ceramic composition is ground with a grinding device such as the ball mill, the attritor or the bead mill, whereby a piezoelectric material (powder) having desirable particle diameters can be obtained. An average particle diameter of the piezoelectric material (the powder) is preferably from 0.05 to 1.0 μm, and further preferably from 0.1 to 0.5 μm. Moreover, the maximum particle diameter of the piezoelectric material (the powder) is preferably 3.0 μm or less, and further preferably 1.5 μm or less. It is to be noted that the particle diameters of the piezoelectric material (the powder) may be regulated by heat-treating a ground material at 400 to 750° C. In consequence, finer particles are integrated with the other particles to form powder having uniform particle diameters, whereby it is possible to obtain the piezoelectric element having the uniform particle diameters. Moreover, the piezoelectric material may be prepared by an alcoxide process, a coprecipitation process or the like.

As a material of the reinforcing plate (the green sheet B), the above piezoelectric material can be used. The same material as the fired piezoelectric body (the green sheet A) is preferably used to obtain the same degree of, thermal expansion.

Next, as a material of the electrodes, a conductive metal is employed. For example, there is preferably used a metal substance such as aluminum, titanium, chromium, iron, cobalt, nickel, copper, zinc, niobium, molybdenum, ruthenium, palladium, rhodium, silver, tin, tantalum, tungsten, iridium, platinum, gold or lead, or an alloy containing two or more of them. For example, silver-platinum, platinum-palladium, silver-palladium and the like may be used alone or as a combination of two or more of them. There may be used a mixture or a cermet of the above material with aluminum oxide, zirconium oxide, titanium oxide, silicon oxide, cerium oxide, glass, the piezoelectric material or the like. The material is preferably selected in accordance with a type of the piezoelectric material.

Hereinafter, examples of the present invention will be described in more detail, but the present invention is not limited to these examples.

Example 1

Figure 4:
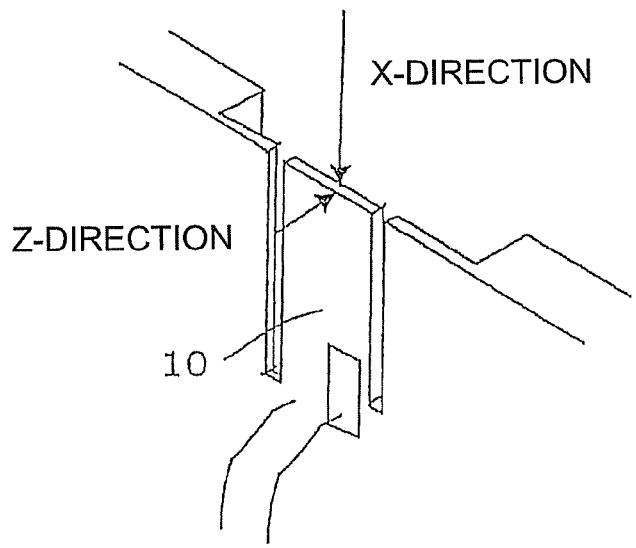
FIG. 4 is a perspective view showing a configuration of the piezoelectric element in an example.

Electrodes were formed on both surfaces of a rectangular fired piezoelectric body having a fixed short side to obtain a piezoelectric element 10 by a method of manufacturing the piezoelectric element according to the present invention (see FIG. 4). The fired piezoelectric body had a thickness of 15 μm, an in-plane maximum length (a long side) of the rectangular fired piezoelectric body was 5 mm, and a short side thereof was 3 mm. A surface roughness Ra of the fired piezoelectric body was 0.19 μm on one surface thereof, and 0.1 μm on the other surface thereof. An undulation amount was 5 μm at maximum, and a thickness variance was 0.6 μm.

It is to be noted that during manufacturing, as a piezoelectric material (of a green sheet A), there was used 0.17Pb(Mg$_{1/3}$Nb$_{2/3}$)O$_3$-0.03Pb(Ni$_{1/3}$Nb$_{2/3}$)O$_3$-0.43PbTiO$_3$-0.37PbZrO$_3$. As to a reinforcing plate for firing (a green sheet B), the same (piezoelectric) material was used, and a thickness thereof was 80 μm. As forming means (green sheet preparation means), a doctor blade process was used. An opening of the reinforcing plate was made by punch processing in a mold. Firing was performed at 1200° C. for two hours. Electrodes were formed by using gold (Au) in a sputtering treatment.

Figure 5:
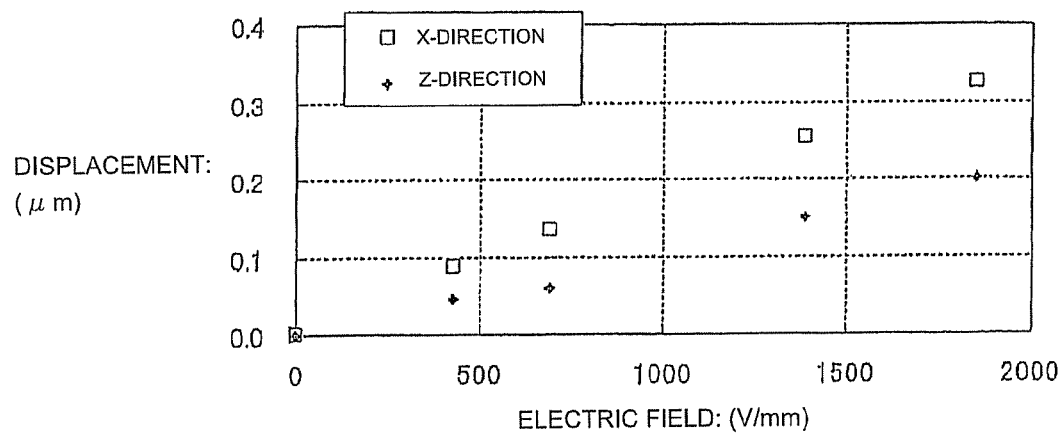
FIG. 5 is a graph showing the results of the example.

The obtained piezoelectric element was polarized at room temperature with 5 kV/mm, an electric field was applied between the electrodes, and displacements in an X-direction and a Z-direction were measured by using a laser Doppler vibrometer (model AT3011 or AT3500 manufactured by GRAPHTEC Corp.) (see FIG. 4). FIG. 5 shows the results of the displacements measured when the electric field was changed, respectively. It is seen from FIG. 5 that the displacement of the piezoelectric element 10 in a thickness direction (the Z-direction) of the fired piezoelectric body is constantly smaller than the displacement thereof in a planar direction (the X-direction). In other words, the piezoelectric element 10 has a large displacement in the planar direction (the X-direction).

Example 2

A fired piezoelectric body having a square shape with a size of 1 mm×1 mm and having a thickness of 15 μm was obtained. The body was prepared in conformity to Example 1 except the outer surface of the obtained fired piezoelectric body.

Figure 6:
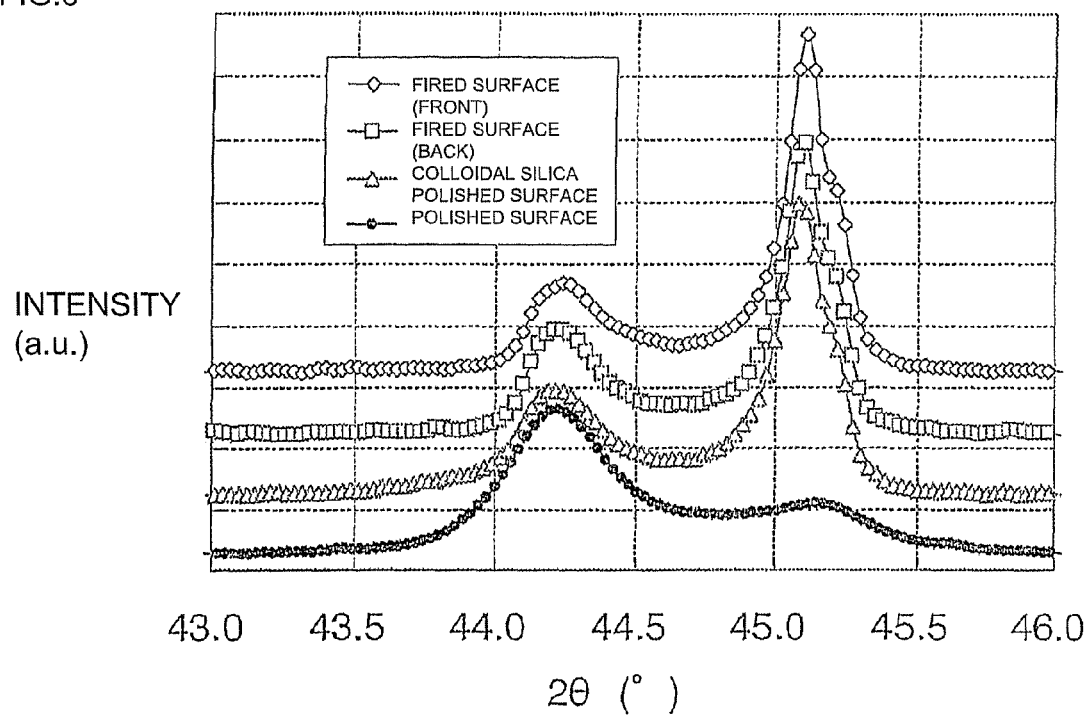
FIG. 6 shows X-ray diffraction profiles of the results of examples, the abscissa indicates a diffraction angle 2θ, and the ordinate indicates a diffraction X-ray intensity (a.u.).

Next, the front surface (the fired surface) of the fired piezoelectric body was irradiated with an X-ray, and an X-ray diffraction profile was measured in a range from 40 to 50° by a 2θ/θ process. The results are shown in FIG. 6. It is seen from the X-ray diffraction profile shown in FIG. 6 that a ratio $I_{002}/I_{200}$ between an intensity $I_{002}$ of a (002) face and an intensity $I_{200}$ of a (200) face was 2.0.

The back surface (the fired surface) of the same fired piezoelectric body was irradiated with the X-ray, and the X-ray diffraction profile was measured in a range from 40 to 50° by the 2θ/θ process. The results are shown in FIG. 6. As obtained from the X-ray diffraction profile shown in FIG. 6, the ratio $I_{002}/I_{200}$ between the intensity $I_{002}$ of the (002) face and the intensity $I_{200}$ of the (200) face was 2.0.

Next, electrodes were formed on both surfaces of the fired piezoelectric body by the sputtering of Au, and a voltage of 5 kV/mm was applied for 15 minutes to perform a polarization treatment. Afterward, when an undulation amount was measured, the amount was 2 μm. Then, a driving durability test was performed with a voltage of 10 V and a rectangular wave of 5 kHz for one hour, and it was confirmed that there was not any problem.

Comparative Example 1

A reinforcing plate for firing (a green sheet B) was not used, but a green sheet (a green sheet A) was simply fired. By such a known manufacturing method, a fired piezoelectric body having a square shape with a size of 1 mm×1 mm and having a thickness of 50 μm was obtained. Next, the surface of the fired piezoelectric body was polished by using a #800 sponge polishing material, to obtain the fired piezoelectric body having a thickness of 15 μm. It is to be noted that except these differences, the same conditions as those of Example 1 were used.

Then, the front surface (the polished surface) of the fired piezoelectric body was irradiated with an X-ray, and an X-ray diffraction profile was measured in a range from 40 to 50° by a 2θ/θ process. The results are shown in FIG. 6. It is seen from the X-ray diffraction profile shown in FIG. 6 that a ratio $I_{002}/I_{200}$ between an intensity $I_{002}$ of a (002) face and an intensity $I_{200}$ of a (200) face was 0.1.

Next, the back surface of the fired piezoelectric body remained to be a fired surface, and was subjected to a polarization treatment in the same manner as in Example 1. Afterward, when an undulation amount was measured, the amount was 60 μm. Then, when a driving durability test was performed with a voltage of 10 V and a rectangular wave of 5 kHz for one hour, cracks were generated in five samples among ten samples.

Comparative Example 2

In the same manner as in Comparative Example 1, a fired piezoelectric body having a square shape with a size of 1 mm×1 mm and having a thickness of 50 μm was obtained. Next, the front surface of the fired piezoelectric body was polished by using colloidal silica of 0.05 μm, to obtain the fired piezoelectric body having a thickness of 15 μm.

Then, the front surface (the polished surface) of the fired piezoelectric body was irradiated with an X-ray, and an X-ray diffraction profile was measured in a range from 40 to 50° by a 2θ/θ process. The results are shown in FIG. 6. It is seen from the X-ray diffraction profile shown in FIG. 6 that a ratio $I_{002}/I_{200}$ between an intensity $I_{002}$ of a (002) face and an intensity $I_{200}$ of a (200) face was 1.3.

Next, the back surface of the fired piezoelectric body remained to be the fired surface, and was subjected to a polarization treatment in the same manner as in Example 1. Afterward, when an undulation amount was measured, the amount was 15 μm. Then, when a driving durability test was performed with a voltage of 10 V and a rectangular wave of 5 kHz for one hour, cracks were generated in one of ten samples.

In Example 2 and Comparative Examples 1 and 2, a used X-ray diffraction device was RINT2500 manufactured by Rigaku Denki K.K. Cu—Kα ray was used as a ray source, and a graphite monochrometer was installed before a detector. On X-ray generating conditions including 35 kV-30 mA, a scan width of 0.02°, a scan speed of 2°/min., a divergent slit of 1° and a light receiving slit of 0.3 mm, the profiles were measured, and it was confirmed that two peaks having large intensities were present in a range of 2θ=from 43 to 46°. In these peaks, the peak at 44.2° was the (002) face, and the peak at 45.2° was the (200) face.

The undulation amount after the polarization treatment was measured with a laser displacement meter LK-G5000 manufactured by KEYENCE Corp.

(Considerations) It is seen from the results of Example 2 and Comparative Examples 1 and 2 that when polishing is performed, an (X-ray) intensity of a (200) face in an X-ray diffraction profile decreases. This is supposedly because a stress is applied owing to the polishing (processing). Therefore, a ratio $I_{002}/I_{200}$ in a polished surface noticeably lowered as compared with a ratio in a fired surface.

A method of manufacturing a piezoelectric element according to the present invention is preferably utilized as means for manufacturing piezoelectric elements disposed in various piezoelectric actuators (piezoelectric devices) applied to a measuring instrument, a photo modulation unit, a photo switch, a micro valve, a conveyance device, an image display device (a display, a projector or the like), an image drawing device, a micro pump, a liquid droplet discharge device, a micro mixture device, a micro stirring device, a micro reaction device and the like, or disposed in various piezoelectric sensors (piezoelectric devices) for use in the detection of fluid characteristics, an acoustic pressure, a micro weight, an acceleration and the like.

What is claimed is:
1. A method of manufacturing a piezoelectric element comprising:
 a step of preparing a green sheet A including a portion which becomes a fired piezoelectric body later, by use of a piezoelectric material;
 a step of joining, to at least one surface of the green sheet A, a green sheet B having an opening in a portion facing the portion which becomes the fired piezoelectric body later, followed by firing to obtain the fired piezoelectric body provided with a reinforcing plate to which the reinforcing plate formed owing to the firing of the green sheet B is attached; and a step of forming an electrode film in a portion obtained by the firing of the green sheet A in the fired piezoelectric body provided with the reinforcing plate, wherein the piezoelectric material contains at least one of lead and bismuth.

2. The method of manufacturing the piezoelectric element according to claim 1, wherein the green sheet B is thicker than the green sheet A.

3. The method of manufacturing the piezoelectric element according to claim 2, wherein the electrode film is formed by one process selected from the group of film forming means consisting of a spin coat process, a sputtering process, a dip process, and a non-contact coating process.

4. The method of manufacturing the piezoelectric element according to claim 2, further comprising, after the step of obtaining the fired piezoelectric body provided with the reinforcing plate, a step of filling the opening of the reinforcing plate with a resin.

5. The method of manufacturing the piezoelectric element according to claim 2, further comprising, after the step of forming the electrode film, a step of joining a peelable peel plate made of a resin film to both surfaces or one surface of the fired piezoelectric body portion or the front surface of the electrode by one process selected from the group of film forming means consisting of a spin coat process, a sputtering process, a dip process and a non-contact coating process.

6. The method of manufacturing the piezoelectric element according to claim 5, wherein the peel plate is peelable by irradiation with light or heating.

7. The method of manufacturing the piezoelectric element according to claim 2, further comprising, after the step of forming the electrode film, a step of removing, from the fired piezoelectric body provided with the reinforcing plate, a portion other than the fired piezoelectric body portion provided with the electrode film by cutting on the basis of one means selected from the group of cutting means consisting of laser, etching, blast, dicer and mechanical processing, to obtain the piezoelectric element.

8. The method of manufacturing the piezoelectric element according to claim 1, wherein the electrode film is formed by one process selected from the group of film forming means consisting of a spin coat process, a sputtering process, a dip process, and a non-contact coating process.

9. The method of manufacturing the piezoelectric element according to claim 8, further comprising, after the step of obtaining the fired piezoelectric body provided with the reinforcing plate, a step of filling the opening of the reinforcing plate with a resin.

10. The method of manufacturing the piezoelectric element according to claim 8, further comprising, after the step of forming the electrode film, a step of joining a peelable peel plate made of a resin film to both surfaces or one surface of the fired piezoelectric body portion or the front surface of the electrode by one process selected from the group of film forming means consisting of a spin coat process, a sputtering process, a dip process and a non-contact coating process.

11. The method of manufacturing the piezoelectric element according to claim 10, wherein the peel plate is peelable by irradiation with light or heating.

12. The method of manufacturing the piezoelectric element according to claim 8, further comprising, after the step of forming the electrode film, a step of removing, from the fired piezoelectric body provided with the reinforcing plate, a portion other than the fired piezoelectric body portion provided with the electrode film by cutting on the basis of one means selected from the group of cutting means consisting of laser, etching, blast, dicer and mechanical processing, to obtain the piezoelectric element.

13. The method of manufacturing the piezoelectric element according to claim 1, further comprising, after the step of obtaining the fired piezoelectric body provided with the reinforcing plate, a step of filling the opening of the reinforcing plate with a resin.

14. The method of manufacturing the piezoelectric element according to claim 13, further comprising, after the step of forming the electrode film, a step of joining a peelable peel plate made of a resin film to both surfaces or one surface of the fired piezoelectric body portion or the front surface of the electrode by one process selected from the group of film forming means consisting of a spin coat process, a sputtering process, a dip process and a non-contact coating process.

15. The method of manufacturing the piezoelectric element according to claim 14, wherein the peel plate is peelable by irradiation with light or heating.

16. The method of manufacturing the piezoelectric element according to claim 13, further comprising, after the step of forming the electrode film, a step of removing, from the fired piezoelectric body provided with the reinforcing plate, a portion other than the fired piezoelectric body portion provided with the electrode film by cutting on the basis of one means selected from the group of cutting means consisting of laser, etching, blast, dicer and mechanical processing, to obtain the piezoelectric element.

17. The method of manufacturing the piezoelectric element according to claim 1, further comprising, after the step of forming the electrode film, a step of joining a peelable peel plate made of a resin film to both surfaces or one surface of the fired piezoelectric body portion or the front surface of the electrode by one process selected from the group of film forming means consisting of a spin Coat process, a sputtering process, a dip process and a non-contact coating process.

18. The method of manufacturing the piezoelectric element according to claim 17, wherein the peel plate is peelable by irradiation with light or heating.

19. The method of manufacturing the piezoelectric element according to claim 1, further comprising, after the step of forming the electrode film, a step of removing, from the fired piezoelectric body provided with the reinforcing plate, a portion other than the fired piezoelectric body portion provided with the electrode film by cutting on the basis of one means selected from the group of cutting means consisting of laser, etching, blast, dicer and mechanical processing, to obtain the piezoelectric element.

20. The method of manufacturing the piezoelectric element according to claim 1, further comprising the step of removing the entire reinforcing plate after the step of forming the electrode film.

21. A method of manufacturing a piezoelectric element comprising:

a step of preparing a green sheet A including a portion which becomes a fired piezoelectric body later, by use of a piezoelectric material;

a step of joining, to at least one surface of the green sheet A, a green sheet B having an opening in a portion facing the portion which becomes the fired piezoelectric body later, followed by firing to obtain the fired piezoelectric body provided with a reinforcing plate to which the reinforcing plate formed owing to the firing of the green sheet B is attached; and a step of forming an electrode film in a portion obtained by the firing of the green sheet A in the fired piezoelectric body provided with the reinforcing plate, wherein the piezoelectric material has a perovskite crystal structure.

22. The method of manufacturing the piezoelectric element according to claim 21, wherein the green sheet B is thicker than the green sheet A.

23. The method of manufacturing the piezoelectric element according to claim 22, wherein the electrode film is formed by one process selected from the group of film forming means consisting of a spin coat process, a sputtering process, a dip process, and a non-contact coating process.

24. The method of manufacturing the piezoelectric element according to claim 22, further comprising, after the step of obtaining the fired piezoelectric body provided with the reinforcing plate, a step of filling the opening of the reinforcing plate with a resin.

25. The method of manufacturing the piezoelectric element according to claim 22, further comprising, after the step of forming the electrode film, a step of joining a peelable peel plate made of a resin film to both surfaces or one surface of the fired piezoelectric body portion or the front surface of the electrode by one process selected from the group of film forming means consisting of a spin coat process, a sputtering process, a dip process and a non-contact coating process.

26. The method of manufacturing the piezoelectric element according to claim 25, wherein the peel plate is peelable by irradiation with light or heating.

27. The method of manufacturing the piezoelectric element according to claim 22, further comprising, after the step of forming the electrode film, a step of removing, from the fired piezoelectric body provided with the reinforcing plate, a portion other than the fired piezoelectric body portion provided with the electrode film by cutting on the basis of one means selected from the group of cutting means consisting of laser, etching, blast, dicer and mechanical processing, to obtain the piezoelectric element.

28. The method of manufacturing the piezoelectric element according to claim 21, wherein the electrode film is formed by one process selected from the group of film forming means consisting of a spin coat process, a sputtering process, a dip process, and a non-contact coating process.

29. The method of manufacturing the piezoelectric element according to claim 28, further comprising, after the step of obtaining the fired piezoelectric body provided with the reinforcing plate, a step of filling the opening of the reinforcing plate with a resin.

30. The method of manufacturing the piezoelectric element according to claim 28, further comprising, after the step of forming the electrode film, a step of joining a peelable peel plate made of a resin film to both surfaces or one surface of the fired piezoelectric body portion or the front surface of the electrode by one process selected from the group of film forming means consisting of a spin coat process, a sputtering process, a dip process and a non-contact coating process.

31. The method of manufacturing the piezoelectric element according to claim 30, wherein the peel plate is peelable by irradiation with light or heating.

32. The method of manufacturing the piezoelectric element according to claim 28, further comprising, after the step of forming the electrode film, a step of removing, from the fired piezoelectric body provided with the reinforcing plate, a portion other than the fired piezoelectric body portion provided with the electrode film by cutting on the basis of one means selected from the group of cutting means consisting of laser, etching, blast, dicer and mechanical processing, to obtain the piezoelectric element.

33. The method of manufacturing the piezoelectric element according to claim 21, further comprising, after the step of obtaining the fired piezoelectric body provided with the reinforcing plate, a step of filling the opening of the reinforcing plate with a resin.

34. The method of manufacturing the piezoelectric element according to claim 33, further comprising, after the step of forming the electrode film, a step of joining a peelable peel plate made of a resin film to both surfaces or one surface of the fired piezoelectric body portion or the front surface of the electrode by one process selected from the group of film forming means consisting of a spin coat process, a sputtering process, a dip process and a non-contact coating process.

35. The method of manufacturing the piezoelectric element according to claim 34, wherein the peel plate is peelable by irradiation with light or heating.

36. The method of manufacturing the piezoelectric element according to claim 33, further comprising after the step of forming the electrode film, a step of removing, from the fired piezoelectric body provided with the reinforcing plate, a portion other than the fired piezoelectric body portion provided with the electrode film by cutting on the basis of one means selected from the group of cutting means consisting of laser, etching, blast, dicer and mechanical processing, to obtain the piezoelectric element.

37. The method of manufacturing the piezoelectric element according to claim 21, further comprising, after the step of forming the electrode film, a step of joining a peelable peel plate made of a resin film to both surfaces or one surface of the fired piezoelectric body portion or the front surface of the electrode by one process selected from the group of film forming means consisting of a spin coat process, a sputtering process, a dip process and a non-contact coating process.

38. The method of manufacturing the piezoelectric element according to claim 37, wherein the peel plate is peelable by irradiation with light or heating.

39. The method of manufacturing the piezoelectric element according to claim 21, further comprising, after the step of forming the electrode film, a step of removing, from the fired piezoelectric body provided with the reinforcing plate, a portion other than the fired piezoelectric body portion provided with the electrode film by cutting on the basis of one means selected from the group of cutting means consisting of laser, etching, blast, dicer and mechanical processing, to obtain the piezoelectric element.

40. The method of manufacturing the piezoelectric element according to claim 21, further comprising the step of removing the entire reinforcing plate after the step of forming the electrode film.

41. The method of manufacturing the piezoelectric element according to claim 21, wherein the piezoelectric material contains at least one of lead and bismuth.

* * * * *